United States Patent
Jo

(10) Patent No.: US 7,317,648 B2
(45) Date of Patent: Jan. 8, 2008

(54) MEMORY LOGIC FOR CONTROLLING REFRESH OPERATIONS

(75) Inventor: Seong-Kue Jo, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/274,632

(22) Filed: Nov. 14, 2005

(65) Prior Publication Data
US 2006/0104141 A1    May 18, 2006

(30) Foreign Application Priority Data
Nov. 16, 2004    (KR) ...................... 10-2004-0093650

(51) Int. Cl.
*G11C 11/00* (2006.01)
(52) U.S. Cl. ...................... 365/222; 365/233
(58) Field of Classification Search ................ 365/222, 365/233
See application file for complete search history.

(56) References Cited

U.S. PATENT DOCUMENTS

| | | | | |
|---|---|---|---|---|
| 5,276,843 A | * | 1/1994 | Tillinghast et al. | 711/105 |
| 5,305,317 A | * | 4/1994 | Szczepanek | 370/257 |
| 5,423,019 A | * | 6/1995 | Lin | 711/135 |
| 5,713,006 A | * | 1/1998 | Shigeeda | 711/170 |
| 6,195,303 B1 | * | 2/2001 | Zheng | 365/222 |
| 6,898,142 B2 | * | 5/2005 | Takahashi | 365/222 |
| 2002/0116592 A1 | * | 8/2002 | Pio | 711/200 |
| 2004/0032772 A1 | * | 2/2004 | Takahashi | 365/202 |
| 2005/0022065 A1 | * | 1/2005 | Dixon et al. | 714/42 |
| 2005/0105357 A1 | * | 5/2005 | Oh | 365/222 |

FOREIGN PATENT DOCUMENTS

| | | |
|---|---|---|
| JP | 07-141864 | 6/1995 |
| JP | 2001-250378 | 9/2001 |
| KR | 1997-4445 | 2/1997 |
| KR | 1998-28895 | 2/1999 |

OTHER PUBLICATIONS

English language abstract of Korea Publication No. 1997-4445.
English language abstract of Korea Publication No. 1998-28895.
English language abstract of Japanese Publication No. 07-141864.
English language abstract of Japanese Publication No. 2001-250378.

\* cited by examiner

*Primary Examiner*—Michael T Tran
(74) *Attorney, Agent, or Firm*—Marger Johnson & McCollom, P.C.

(57) ABSTRACT

In a self-refresh mode, alternative refresh commands such as auto-refresh and row active commands are applied to a volatile memory device in response to stored refresh and address information to implement different refresh times for memory cells having different refresh characteristics.

34 Claims, 3 Drawing Sheets

US 7,317,648 B2

MEMORY LOGIC FOR CONTROLLING REFRESH OPERATIONS

This U.S. non-provisional patent application claims priority under 35 U.S.C. § 119 from Korean Patent Application 2004-93650 filed on Nov. 16, 2004, the entire contents of which are hereby incorporated by reference.

BACKGROUND

The power consumption of integrated circuits (ICs) is an important design consideration in most electronic products. For example, the power consumption of memory devices used in portable electronic products such as portable computers, personal digital assistants (PDAs) and wireless phone affects the amount of time these products can be used before the batteries must be recharged. Even in products that are not battery operated, the power consumption of memory devices should me minimized to reducing heating effects and conserve energy.

The power consumption of a memory device generally increases as its memory capacity and operation speed increase. In a dynamic random access memory (DRAM), for example, memory cells are refreshed by activating rows of memory cells in rapid sequence. Refresh operations consume a relatively large amount of power: a pair of bit lines are switched to complementary voltages and then equalized each time the memory cells of a row are refreshed. As the number of cells in a memory array increases, so too does the amount of power required to refresh the cells. Moreover, the power consumption also increases as the cell activation rate increases. Accordingly, as the operational speed and memory capacity of DRAMs continue to increase, an ever increasing amount of power is required to refresh memory cells.

Referring to FIG. 1A, a memory cell MC of a typical DRAM includes one switch transistor T and a capacitor C. The switch transistor T is connected to a row or a word line WL. Charges stored on the capacitor C are transmitted to a column or a bit line BL through the switch transistor T when word line WL is activated. When WL is deactivated, charges are ideally prevented from being transmitted to the bit line. However, the charges stored on a capacitor leaked through well-known leakage paths, and this prevents the memory cell from retaining its data indefinitely. Thus, a DRAM is known as a volatile memory.

The amount of time that the memory cells in a DRAM can retain data before they must be refreshed can be determined before the device is installed in a product. There is, however, a certain amount of variation in the refresh time for the different cells within a device. FIG. 1B which shows the statistical distribution of data retention times for memory cells in an exemplary DRAM. From FIG. 1B, it is apparent that the data retention or refresh times of the memory cells are within a wide range. Memory cells having the shortest data retention time are referred to as "weak" cells and are indicated by the region marked with a dotted line in FIG. 1B.

To provide reliable storage of data, conventional volatile memories use the refresh times of the weakest memory cells as the time basis for refreshing all of the cells in the memory array. Thus, the majority of cells having relatively long data retention times are refreshed more frequently than is necessary, thereby unnecessarily increasing the amount of power required for refresh operations.

SUMMARY

In one exemplary embodiment according to the inventive principles of this patent disclosure, an embedded memory logic includes a first memory to store refresh and address information for a second memory; and refresh logic to generate refresh commands for the second memory in response to the refresh and address information.

In another exemplary embodiment according to the inventive principles of this patent disclosure, a memory system includes a host, a DRAM coupled to the host to receive addresses, control signals and clock signals, and embedded memory logic coupled to the host to receive the control signals, the clock signal and a clock enable signal, wherein the embedded memory logic provides the clock enable signal to the DRAM without changes depending on an operational mode.

Another exemplary embodiment according to the inventive principles of this patent disclosure includes storing refresh and address information for a volatile memory device, monitoring refresh commands sent from a host to the volatile memory device, and applying alternative commands to the volatile memory device according to the refresh and address information in response to a refresh mode command being sent from the host to the volatile memory device.

In another exemplary embodiment according to the inventive principles of this patent disclosure, memory logic includes interface logic to receive refresh commands from a host and send refresh commands to a volatile memory device having memory cells with different refresh characteristics, and refresh logic to generate the refresh commands to be sent to the volatile memory device according to the different refresh characteristics of the memory cells.

DETAILED DESCRIPTION

The inventive principles of the patent disclosure will now be described with reference to the accompanying drawings, in which preferred embodiments are shown. Although some specific details are shown for purposes of illustrating the preferred embodiments, other effective arrangements can be devised in accordance with the inventive principles of this patent disclosure. Thus, the inventive principles are not limited to the specific details disclosed herein.

Figure 1A:
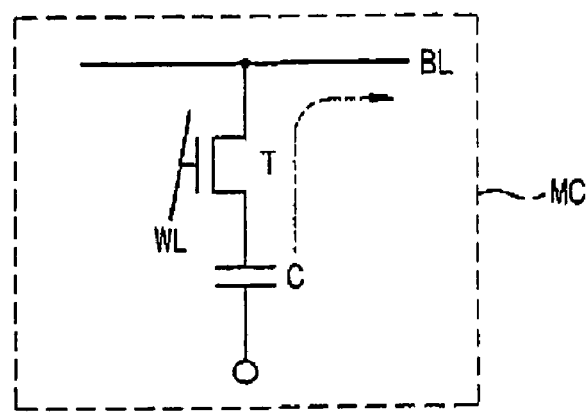
FIG. 1A illustrates a conventional DRAM cell.
Figure 1B:
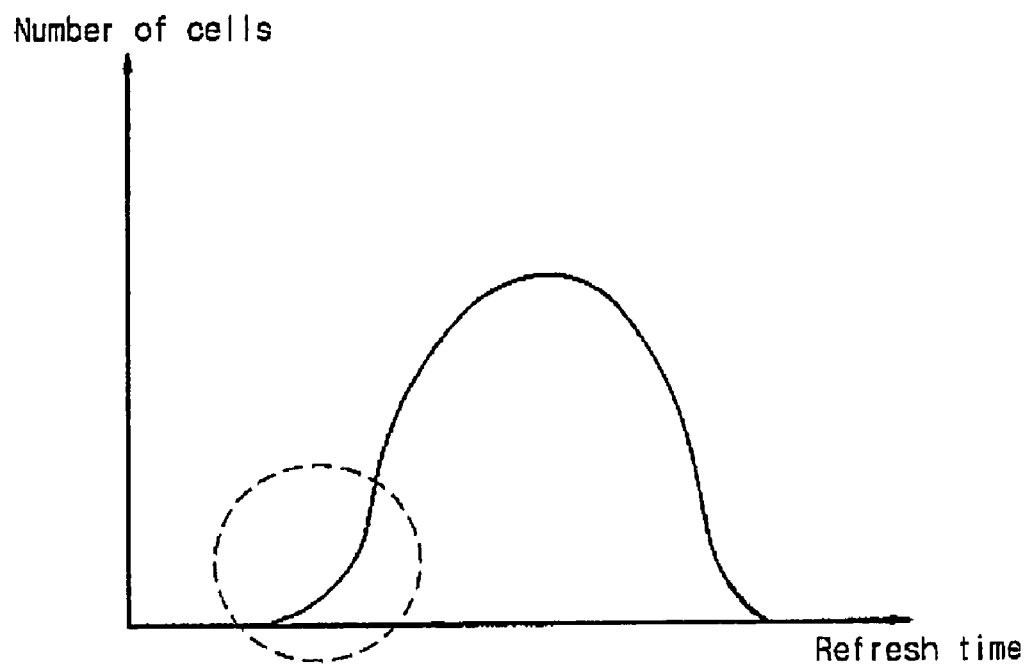
FIG. 1B illustrates the distribution of data retention times of memory cells in a conventional DRAM device.
Figure 2:
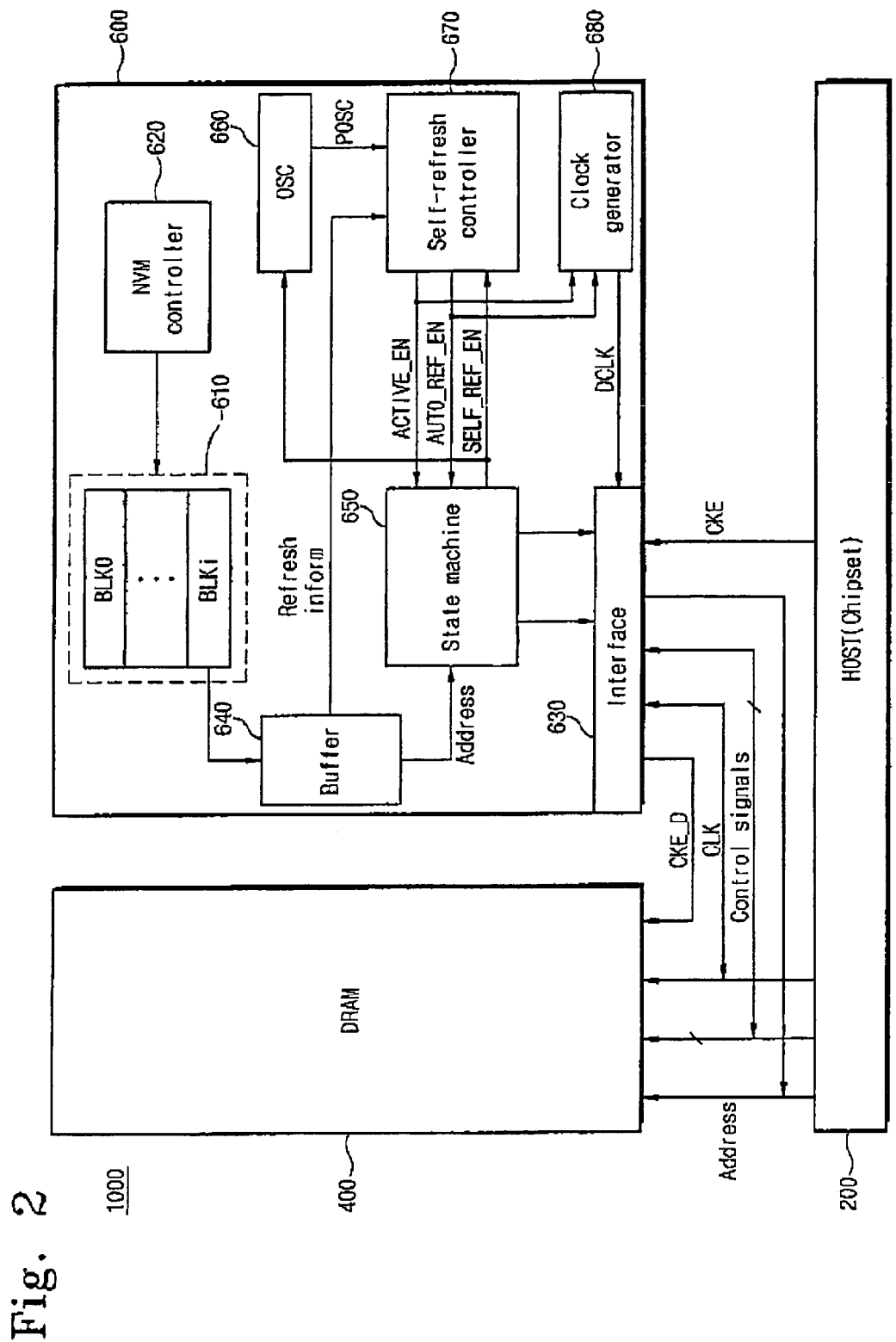
FIG. 2 illustrates an embodiment of a memory system in accordance with some inventive principles of this patent disclosure.

FIG. 2 illustrates an embodiment of a memory system in accordance with some inventive principles of this patent disclosure. Referring to FIG. 2, the memory system 1000 includes a host (for example, a chipset) 200, a DRAM 400 and embedded memory logic 600, which, in this example, includes a non-volatile memory device. The DRAM 400 is a conventional device that supports auto-refresh and self-refresh operations. Preferably, the embedded memory logic includes a NAND flash memory, and the DRAM 400 is a synchronous DRAM memory (SDRAM). However, the inventive principles of the patent disclosure are not limited these particular types of volatile and non-volatile memories. Likewise, the DRAM and the embedded memory logic may be implemented as a multi-chip package (MCP), as individual integrated circuit, or in any other appropriate manner.

The embedded memory logic 600 is configured to control refresh operations of the DRAM 400 in response to self-refresh commands applied to the DRAM 400 from the host 200. As shown in FIG. 2, the embedded memory logic 600 receives control signals such as /CS, /WE, /CAS and /RAS from the host 200, a clock enable signal CKE and a clock signal CLK, most of which are also received directly by the DRAM. The clock enable signal CKE, however, is not applied to the DRAM. Instead, a modified clock enable signal CKE_D is generated by the embedded memory logic in response to the clock enable signal and applied to the DRAM.

As is known in the art, the conventional DRAM 400 is placed in auto-refresh mode by driving control signals /CS, /RAS and /CAS low while at the same time holding the clock enable signal CKE and the control signal /WE high. In contrast, the DRAM may be placed in self-refresh mode by driving control signals /CS, /RAS and /CAS and the clock enable signal CKE low while holding /WE high. In other words, the state of a clock enable signal CKE determines whether the DRAM is place in self-refresh or auto-refresh mode. If the DRAM is place in self-refresh mode, output terminals from the host 200, for example, buffers for driving control signals, an address and data, enter a floating state.

Referring again to FIG. 2, the embedded memory logic 600 includes a non-volatile memory core 610, and refresh and interface logic including a memory control block 620, an interface block 630, a buffer 640, a state machine 650 which functions as control logic, an oscillation block 660, a self-refresh control block 670 and a clock generating block 680.

The non-volatile memory core 610 includes a memory cell array consisting of a plurality of memory blocks BLK0 to BLKi. At least one block is used for storing address information for the DRAM 400. As described above, the memory cells have different data retention or refresh times. Therefore, row addresses of weak memory cells (those requiring a relatively short refresh time) are stored in one or more of the memory blocks, as well as information related to refresh and row active operations of the DRAM 400, for example, a refresh time tREF, a refreshing number, a row active number, a row active period and so on. The address and refresh related information is stored in a the blocks under control of the memory control block 620. The memory control block 620 communicates with the host 200 through an interface block (not shown). The addresses of weak memory cells that require a relatively short refresh time can be obtained, for example, through any wafer-level test operations which are well known to those having ordinary skill in the art.

The interface block 630 is configured to receive control signals /CS, /WE, /RAS and /CAS, a clock enable signal CKE, and a clock signal CLK from the host 200 and to output a modified clock enable signal CKE_D, control signals /CS, /WE, /RAS and /CAS and an address to the DRAM 400. Addresses from the embedded memory logic 600 may be provided to the DRAM 400 only at certain times as described below. The interface block 630 outputs received commands (a combination of /CS, /CAS, /RAS, /WE and CKE) to the state machine 650. If the received command is a self-refresh command, interface block 630 relays the clock enable signal CKE to the DRAM 400 as CKE_D without delay or modification. At other times, the embedded memory logic may generate CKE_D as a modified signal in response to the CKE and/or the refresh and address information stored in the non-volatile memory 610, and then output the modified enable signal to the DRAM.

The buffer 640 is configured to store addresses of weak memory cells read from the memory blocks BLK0 to BLKi and the refresh related information under control of the memory control block 620 when a power is up. In the buffer 640, read and write operations may be controlled by the state machine 650 or the memory control block 620. The buffer 640 is preferably a static random access memory SRAM, although the addresses of weak memory cells and refresh related information may be stored in other storage media as well.

The state machine 650 generates a self-refresh enable signal SELF_REF_EN in response to a command received through the interface block 630. The state machine 650 outputs a row active command and addresses of weak memory cells from the buffer 640 to the interface block 630 in response to an active enable signal ACTIVE_EN from the self refresh control block 670. The interface block 630 then outputs an address and a row active command from the state machine 650 to the DRAM 400. The state machine 650 outputs an auto-refresh command to the interface block 630 in response to an auto-refresh enable signal AUTO_REF_EN form the self-refresh control block 670. The interface block 630 then outputs the auto-refresh command from the state machine 650 to the DRAM 400.

The oscillation block 660 generates an oscillation signal POSC in response to the self-refresh enable signal SELF_REF_EN. The self-refresh control block 670 transfers the refresh information from the buffer 640 in response to a self-refresh enable signal SELF_REF_EN and an active enable signal ACTIVE_EN or an auto-refresh enable signal AUTO_REF_EN in accordance with an oscillation signal POSC from the oscillation block 660. The clock generating block 680 generates an internal clock DCLK in response to an active enable signal ACTIVE_EN or an auto-refresh enable signal AUTO_REF_EN.

The apparatus described above allows the embedded memory logic 600 to bifurcate a self-refresh operation of the DRAM 400. In other words, the self-refresh operation of the DRAM 400 is divided into an auto-refresh operation and a row active operation. The auto-refresh operation is carried out to refresh memory cells having a relatively long data retention time, while the row active operation is carried out to refresh memory cells having a relatively short data retention time. Thus it may be possible to reduce the power required for refresh operations of the DRAM 400 by controlling the refresh operations depending on the refresh characteristics of different memory cells.

Figure 3:
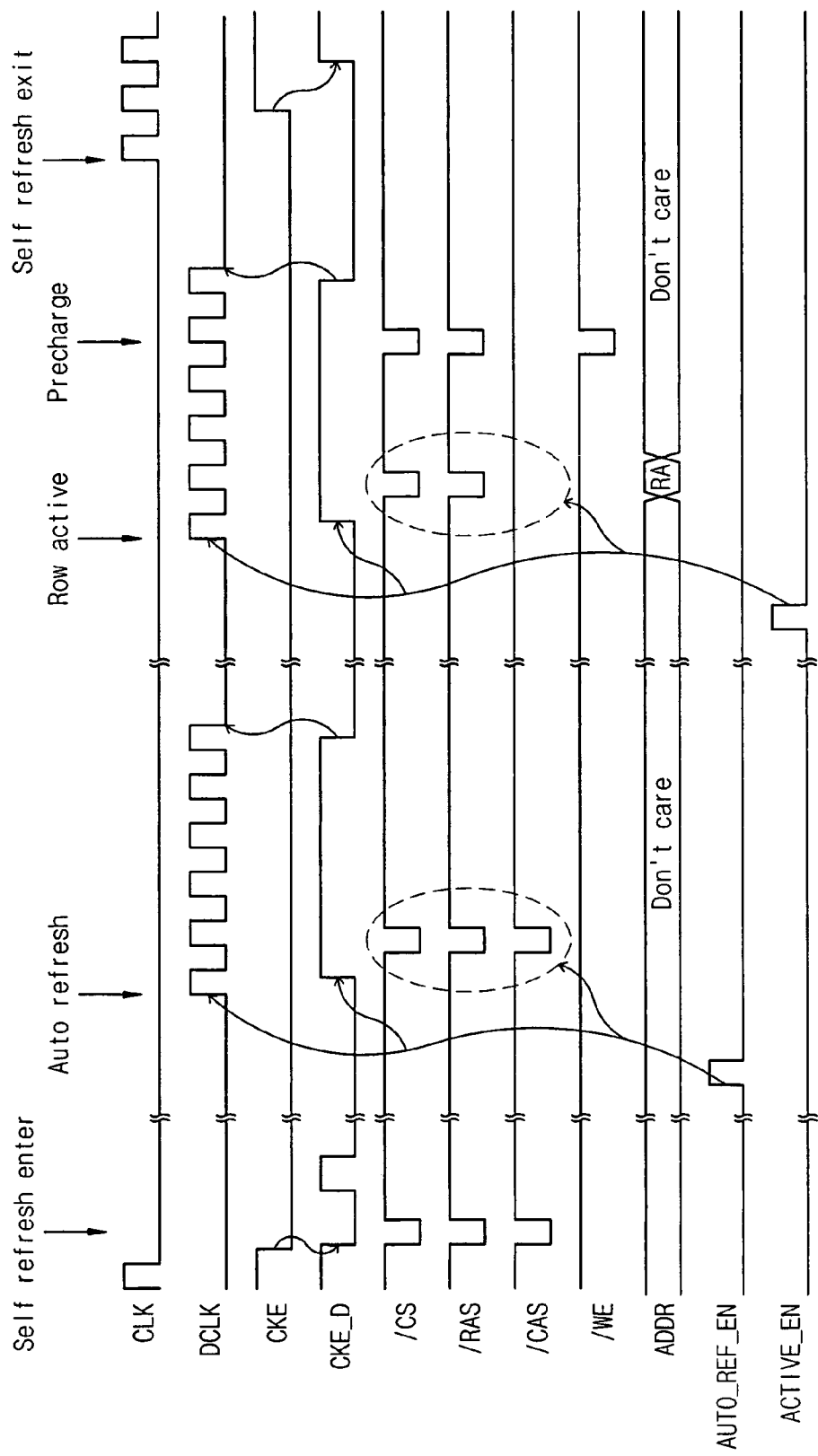
FIG. 3 is a timing diagram illustrating an embodiment of a memory refresh operation in accordance with some inventive principles of this patent disclosure.

FIG. 3 illustrates an embodiment of a memory refresh operation in accordance with some inventive principles of this patent disclosure. A conventional DRAM 400 supports a self-refresh mode for data retention and low power consumption. In self-refresh mode, the host 200 stops driving the clock signal CLK and places its output terminals in a floating state to prevent interference with output signals from the embedded memory logic 600. Once the DRAM enters self-refresh mode, all of its input buffers are disabled, and all inputs including the clock are ignored to maintain self-refresh mode.

The self-refresh mode command is sent from the host 200 to the DRAM 400 by driving signals /CS, /WE, /RAS, /CAS and CKE low and control signal /WE high. The interface block 630 of the embedded memory logic 600 relays the clock enable signal CKE to the DRAM 400 as the modified clock enable signal CKE_D in accordance with the self-refresh command without a delay or a change. This causes the DRAM 400 to enter self-refresh mode. Next, the interface block 630 of the embedded memory logic 600 drives CKE_D high after a predetermined time $t_{RFC}$ passes. (An internal address generation process is performed inside the DRAM during this time period, but a row active operation is not performed.) Again, after a precharge time for the DRAM 400 passes, the interface block 630 of the embedded memory logic 600 sets CKE_D to low.

When a self-refresh command is applied to the state machine 650 through the interface block 630 of the embedded memory logic 600, the state machine 650 asserts the self-refresh enable signal SELF_REF_EN. The oscillation block 660 starts to generate an oscillation signal POSC in response to the self-refresh enable signal SELF_REF_EN. At the same time, the refresh information stored in the buffer 640 is transferred to the self-refresh control block 670 under the control of the state machine 650. Next, the self-refresh control block 670 asserts the auto-refresh enable signal AUTO_REF_EN or the active enable signal ACTIVE_EN in response to the oscillation signal POSC, the self-refresh enable signal SELF_REF_EN and refresh information. As described above, the auto-refresh enable signal AUTO_REF_EN is asserted for refreshing memory cells having a relatively long data retention time, and the active enable signal ACTIVE_EN is asserted for refreshing memory cells having a relatively short data retention time. In other words, in the self-refresh mode, a first refresh time $t_{REF1}$, and a second refresh time $t_{REF2}$ exist. In this embodiment, the first refresh time $t_{REF1}$ for refreshing a memory cell having a relatively long data retention time is longer than the second refresh time $t_{REF2}$ for refreshing a weak memory cell having a relatively short data retention time. The second refresh time $t_{REF2}$ may be, for example, the maximum refresh time described in a product specification, which is likely to be determined by the weakest memory cells in the device.

The self-refresh control block 670 determines if an auto-refresh operation is to be performed or if a row active operation is to be performed using the oscillation signal POSC. If the auto-refresh operation is to be performed, the self-refresh control block 670 activates the auto-refresh enable signal AUTO_REFEN. When the auto-refresh enable signal AUTO_REF_EN is activated, the state machine 650 controls the interface block 630 so that the clock enable signal CKE_D is driven high. At the same time, the clock generating block 680 generates the internal clock DCLK in response to the auto-refresh enable signal AUTO_REF_EN. Next, the state machine 650 generates an auto-refresh command, and transfers the same to the DRAM 400 through the interface block 630. As shown in FIG. 3, an auto-refresh command is generated by setting signals /CS, /RAS and /CAS low when the clock enable signal CKE_D and control signal /WE are maintained high. At this time, the DRAM 400 refreshes the memory cells of one or more rows in response to the auto-refresh command. Here, the refreshed memory cells are memory cells having the first refresh time $t_{REF1}$ or a relatively long data retention time. After the auto-refresh operation is performed, the clock enable signal CKE_D is driven low, and generation of DCLK ceases.

During self-refresh mode, the self-refresh control block 670 continuously determines whether an auto-refresh operation performed or a row active operation is to be performed based on the oscillation signal POSC. If the row active operation is to be performed, the self-refresh control block 670 asserts the active enable signal ACTIVE_EN. When the active enable signal ACTIVE_EN is asserted, the state machine 650 controls the interface block 630 so that the clock enable signal CKE_D is driven high. At the same time, the clock generating block 680 generates the internal clock DCLK in response to an active enable signal ACTIVE_EN. Next, the state machine 650 generates a row active command along with a row address of the weak memory cells, and transfers the same along with a row address to the DRAM 400 through the interface block 630. As shown in FIG. 3, row active commands are generated by driving signals /CS and /RAS low when the signals CKE_D, /WE and /CAS are maintained at a high level. At this time, the DRAM 400 refreshes memory cells at the row address received along with the row active command. Here, the refreshed memory cells are memory cells having the second refresh time $t_{REF2}$, or a relatively short data retention time. When the row active operation is performed, as shown in FIG. 3, the state machine 650 generates a precharge command, and precharge operation is performed in response to the precharge command. Next, the clock enable signal CKE_D is set driven low, and production of the internal clock DCLK ceases.

During self-refresh mode, the above described auto-refresh and row active operations of the DRAM 400 are automatically performed under a control of the embedded memory logic 600 in accordance with a predetermined refresh and active period. In other words, a memory system according to the inventive principles of this patent disclosure may independently control refresh operations of memory cells requiring a relatively short refresh time and memory cells requiring a relatively long refresh time. As a result, it may be possible to reduce the power consumption or current in the self-refresh mode. As described above, when a self-refresh command is generated by a host, the self-refresh operations of a DRAM may be divided into auto-refresh operations and row active operations based on the different data retention times of various memory cells, thereby reducing self-refresh current and/or standby current.

While the present invention has been described in detail with reference to certain preferred embodiments, it should be apparent that modifications and adaptations to those embodiments might occur to a person skilled in the art without departing from the inventive principles of this patent disclosure.

The invention claimed is:

1. Embedded memory logic comprising:
   a first memory to store refresh and address information for a second memory; and
   refresh logic to generate refresh commands for the second memory in response to the refresh and address information;
   wherein:
   the first memory is a non-volatile memory;
   the refresh commands include auto-refresh commands and row active commands; and
   the refresh logic includes a refresh control block to generate the refresh commands responsive to a self-refresh command.

2. The embedded memory logic of claim 1, wherein the second memory is a DRAM in a system in which the embedded memory logic is included.

3. The embedded memory logic of claim 2, wherein the refresh control block is configured to provide the address information when the row active command is provided to the DRAM.

4. The embedded memory logic of claim 2, wherein the refresh control block is configured to periodically send the auto-refresh commands to the DRAM during self-refresh mode to refresh first non-volatile memory cells having a first refresh time.

5. The embedded memory logic of claim 4, wherein the refresh control block is configured to periodically send the row active commands together with the address information to the DRAM during self-refresh mode to refresh second non-volatile memory cells having a second refresh time shorter than the first refresh time.

6. The embedded memory logic of claim 2, further comprising:
a first terminal to receive a first clock enable signal; and
a second terminal to output a second clock enable signal to the DRAM.

7. The embedded memory logic of claim 6, further comprising:
third terminals to receive control signals;
fourth terminals to input/output a clock signal; and
fifth terminals to output address signals.

8. The embedded memory logic of claim 2, wherein the refresh control block is configured to generate a precharge command after a row active command is performed by the DRAM.

9. The embedded memory logic of claim 1, wherein the non-volatile memory includes NAND-structured non-volatile memory cells.

10. The embedded memory logic of claim 1, further comprising a non-volatile memory control block to control the non-volatile memory.

11. Embedded memory logic comprising:
a first memory to store refresh and address information for a second memory; and
refresh logic to generate refresh commands for the second memory in response to the refresh and address information;
wherein:
the first memory is a non-volatile memory;
the second memory includes first volatile memory cells with a first refresh time and second volatile memory cells having a second refresh time shorter than the first refresh time;
the refresh logic includes a refresh control block to operate in response to the address information stored in the non-volatile memory and a received self-refresh command; and
the refresh control block is configured to output auto-refresh commands to refresh the first volatile memory cells, and to output row active commands and address information to refresh the second volatile memory cells during self-refresh mode.

12. The embedded memory logic of claim 11, wherein the refresh control block comprises:
an interface block;
control logic to generate a self-refresh enable signal in response to a self-refresh command received by the interface block;
an oscillation block to generate an oscillation signal in response to the self-refresh enable signal; and
a self-refresh control block to generate an active enable signal and an auto-refresh enable signal in response to the oscillation signal, the refresh information and the self-refresh enable signal.

13. The embedded memory logic of claim 12, wherein the auto-refresh commands and the row active commands are provided to a DRAM in a memory system with which the embedded memory logic is included.

14. The embedded memory logic of claim 13, wherein the control logic is configured to generate the auto-refresh commands in response to the auto-refresh enable signal, and the auto-refresh commands are provided to the DRAM through the interface block.

15. The embedded memory logic of claim 13, wherein the control logic is configured to generate the row active command in response to the row active enable signal, and the row active command and the address information are provided to the DRAM through the interface block.

16. The embedded memory logic of claim 13, wherein the refresh control block further comprises a buffer to store the address information and the refresh information from the non-volatile memory block.

17. The embedded memory logic of claim 13, wherein the refresh control block further comprises a clock generating block to generate an internal clock in response to the auto-refresh enable signal and the active enable signal.

18. The embedded memory logic of claim 17, wherein the internal clock is provided to the DRAM together with the row active and auto-refresh commands through the interface block.

19. A memory system comprising:
a host;
a DRAM coupled to the host to receive addresses, control signals and clock signals; and
embedded memory logic coupled to the host to receive the control signals, the clock signal and a clock enable signal;
wherein the embedded memory logic provides the clock enable signal to the DRAM without changes depending on an operational mode.

20. The memory system of claim 19, wherein there is no direct transfer of the clock enable signal between the DRAM and the host.

21. The memory system of claim 19, wherein the control signals include /WE, /CS, /RAS and /CAS signals.

22. The memory system of claim 19, wherein the embedded memory logic comprises:
a non-volatile memory to store refresh information and address information for the DRAM; and
a refresh control block to output an auto-refresh command and a row active command to the DRAM in accordance with the refresh information when a self-refresh command is received from the host.

23. The memory system of claim 22, wherein the refresh control block is configured to periodically output the auto-refresh command when the DRAM is in self-refresh mode to refresh first volatile memory cells in the DRAM having a first refresh time, and to periodically output the row active command together with the address information when the DRAM is in self-refresh mode to refresh second volatile memory cells having a second refresh time shorter than the first refresh time.

24. A method comprising:
storing refresh and address information for a volatile memory device;
monitoring refresh commands sent from a host to the volatile memory device; and
applying alternative commands to the volatile memory device according to the refresh and address information in response to a refresh mode command being sent from the host to the volatile memory device;
wherein applying alternative commands to the volatile memory device comprises:

applying a first alternative command to the volatile memory device for memory cells having the first refresh time, and applying a second alternative command to the volatile memory device for memory cells having the second refresh time.

25. The method of claim 24, wherein the first alternative command is an auto-refresh command, and the second alternative command is a row active command.

26. A method comprising:

storing refresh and address information for a volatile memory device;

monitoring refresh commands sent from a host to the volatile memory device; and applying alternative commands to the volatile memory device according to the refresh and address information in response to a refresh mode command being sent from the host to the volatile memory device;

wherein applying alternative commands to the volatile memory device includes modifying a clock enable signal sent from the host to the volatile memory device.

27. The method of claim 26, wherein the refresh and address information is stored in a non-volatile memory.

28. The method of claim 26, wherein the refresh mode command is a self-refresh command.

29. The method of claim 26, wherein the volatile memory device includes memory cells having first and second refresh times.

30. Memory logic comprising:

interface logic to receive refresh commands from a host and send refresh commands to a volatile memory device having memory cells with different refresh characteristics; and refresh logic to generate the refresh commands to be sent to the volatile memory device according to the different refresh characteristics of the memory cells.

31. The memory logic of claim 30, wherein the interface and refresh logic is configured to:

receive an enable signal from a host;

generate a modified enable signal in response to the enable signal and the different refresh characteristics of the memory cells of the volatile memory device; and output the modified enable signal to the volatile memory device.

32. The memory logic of claim 31, wherein the enable signal is a clock enable signal.

33. The memory logic of claim 30, further comprising a non-volatile memory for storing refresh and address information for the memory cells of the volatile memory device.

34. The memory logic of claim 30, wherein:

the volatile memory device is a DRAM having a self-refresh mode;

the interface and refresh logic send auto-refresh commands to the DRAM for memory cells having a first refresh time; and the interface and refresh logic send row-active commands to the DRAM for memory cells having a second refresh time.

* * * * *

UNITED STATES PATENT AND TRADEMARK OFFICE
CERTIFICATE OF CORRECTION

PATENT NO. : 7,317,648 B2  Page 1 of 1
APPLICATION NO. : 11/274632
DATED : January 8, 2008
INVENTOR(S) : Seong-Kue Jo It is certified that error appears in the above-identified patent and that said Letters Patent is hereby corrected as shown below:

Column 5, line 44, the word "AUTO_REFEN" should read -- AUTO_REF_EN --.

Signed and Sealed this

Seventh Day of October, 2008

JON W. DUDAS
*Director of the United States Patent and Trademark Office*